United States Patent [19]

Kohara et al.

[11] Patent Number: 5,281,508

[45] Date of Patent: Jan. 25, 1994

[54] POSITIVE-WORKING PHOTORESIST CONTAINING O-NAPHTHOQUINONE DIAZIDE SULFONIC ACID ESTER AND NOVOLAK RESIN CONSISTING OF 35 TO 43% M-CRESOL AND 65 TO 57% P-CRESOL WITH SUBSTANTIAL ABSENCE OF O-CRESOL

[75] Inventors: Hidekatsu Kohara, Chigasaki; Hatsuyuki Tanaka, Samukawa; Masanori Miyabe, Fujisawa, all of Japan; Yoshiaki Arai, Mountain View, Calif.; Shingo Asaumi, Fujisawa, Japan; Toshimasa Nakayama, Hiratsuka, Japan; Akira Yokota, Yamato, Japan; Hisashi Nakane, Yokohama, Japan

[73] Assignee: Tokyo Ohka Kogyo Co., Ltd., Kawaski, Japan

[21] Appl. No.: 935,131

[22] Filed: Aug. 21, 1992

Related U.S. Application Data

[63] Continuation of Ser. No. 155,257, Feb. 12, 1988, abandoned, which is a continuation-in-part of Ser. No. 892,116, Aug. 4, 1986, abandoned.

[30] Foreign Application Priority Data

Aug. 9, 1985 [JP] Japan .................. 60-174316

[51] Int. Cl.$^5$ .............................. G03F 7/023
[52] U.S. Cl. ........................ 430/192; 430/165; 430/190; 430/193
[58] Field of Search .............. 430/190, 191, 192, 193, 430/165; 538/153

[56] References Cited

U.S. PATENT DOCUMENTS

| | | | |
|---|---|---|---|
| 4,377,631 | 3/1983 | Toukhy et al. | 430/192 |
| 4,404,357 | 9/1983 | Taylor et al. | 528/153 |
| 4,587,196 | 5/1986 | Toukhy | 430/192 |
| 4,731,319 | 3/1988 | Kohara et al. | 430/192 |

FOREIGN PATENT DOCUMENTS

| | | |
|---|---|---|
| 3626582 | 2/1987 | Fed. Rep. of Germany . |
| 62-35349 | 2/1987 | Japan . |
| 2180842 | 4/1987 | United Kingdom . |

OTHER PUBLICATIONS

Pampalone, T. R., Solid State Tech., Jun. 1984, pp. 115-120.

*Primary Examiner*—Charles L. Bowers, Jr.
*Assistant Examiner*—Christopher G. Young
*Attorney, Agent, or Firm*—Hopgood, Calimafde, Kalil, Blaustein & Judlowe

[57] ABSTRACT

A positive-working photoresist composition suitable for fine patterning in the manufacture of semiconductor devices, e.g., VLSIs, with high fidelity is proposed. The composition comprises 100 parts by weight of a cresol novolac resin and 25-60 parts by weight of a naphthoquinone diazide sulfonic acid ester as the photosensitive component while the cresol novolac resin component is prepared from a mixture of cresol isomers composed of 35-43% of m-cresol and 65-57% of p-cresol with substantial absence of o-cresol or composed of 35-43% of m-cresol, 65-57% of p-cresol and 1% or less of o-cresol.

3 Claims, 1 Drawing Sheet

POSITIVE-WORKING PHOTORESIST CONTAINING O-NAPHTHOQUINONE DIAZIDE SULFONIC ACID ESTER AND NOVOLAK RESIN CONSISTING OF 35 TO 43% M-CRESOL AND 65 TO 57% P-CRESOL WITH SUBSTANTIAL ABSENCE OF O-CRESOL

This application is a continuation of application Ser. No. 155,257, filed Feb. 12, 1988, now abandoned, which is a continuation-in-part of Ser. No. 892,116, filed Aug. 4, 1986, now abandoned.

BACKGROUND OF THE INVENTION

The present invention relates to a positive-working photoresist composition or, more particularly, to a positive-working photoresist composition suitable for use in fine patterning of a photoresist layer in the manufacturing process of semiconductor-based devices such as LSIs, VLSIs and the like.

Recent progress in the semiconductor technology day by day has aroused a rapidly increasing demand for computerized instruments including computers for industrial use, instruments for automatization of offices, personal computers and the like and, corresponding thereto, semiconductor devices such as integrated circuits are under an overwhelming trend toward increase in the density or degree of integration. For example, the times are already entering the era of VLSIs having a density of 1 megabit or higher after passing through the ages of 256 kilobits. Such a high density of integration in VLSIs naturally requires extremely fine patterning on semiconductor wafers in the so-called submicron range. For example, the minimum line width to be reproduced with high fidelity in the photoresist layer is about 2 $\mu$m in semiconductor ICs for 256 kilobits DRAMs, about 1.0 to 1.3 $\mu$m in devices for 1 megabit DRAMs and about 0.5 to 0.8 $\mu$m is devices for 4 megabits DRAMs so that the technology of patterning must comply with such an extremely high precision.

As is known, the patterning works on the semiconductor wafers for the manufacture of integrated circuits are performed by the technology of photolithography using a photoresist composition. Of the two types of photoresist compositions including positive-working and negative-working ones, the positive-working photo-resist compositions are preferred widely in the works of fine patterning in which high-fidelity reproduction of a line pattern having a width of 1 to 2 $\mu$m is essential.

The principal ingredients in most of the conventional positive-working photoresist compositions are an alkali-soluble novolac resin as the film-forming constituent and a quinone diazide compound as the photodecomposable or photosensitive constituent in the form of a mixture. Typical photosensitizer compounds of the quinone diazide type include sulfonic acid esters formed between a naphthoquinone diazide sulfonic acid and a compound having one or more of phenolic hydroxy groups disclosed in U.S. Pat. No. 3,402,044 and other esters disclosed in U.S. Pat. No. 3,046,118, No. 3,106,465 and No. 3,148,983.

In respect of the film-forming constituent of the photoresist compositions which is typically an alkali-soluble novolac resin, on the other hand, various types of novolac resins have been proposed including phenol formaldehyde novolac resins disclosed in U.S. Pat. No. 3,402,044 and cresol novolac resins disclosed in Electrochemistry and Industrial Physical Chemistry, volume 48, page 584 (1980). Further, Japanese Patent Kokai 58-17112 teaches that the sensitivity of a positive-working photoresist composition comprising a cresol novolac resin as the film-forming constituent can be improved by suitably selecting the proportion of the cresol isomers in the cresol used in the preparation of the cresol novolac resin.

Turning now to the problems in the process of exposure of the photoresist layer to light, the exposure is carried out either by the exposure by direct contacting or by the exposure by minifying projection. In the former method of contacting exposure, the photoresist layer formed on the surface of a semiconductor wafer is exposed to light through a patterned photomask in direct contact with the photoresist layer. This method is advantageous in respect of the contrast of the patterned image so that a patterned photoresist layer of a considerably high contrast can be obtained by this method even when the photoresist composition used there is inherently inferior in respect of the contrast and fidelity of the pattern reproduction. On the contrary to the advantages, this method has some disadvantages and problems. For example, the photomask is sometimes damaged mechanically as a natural consequence of direct contact with the photoresist layer in each time of exposure so that extreme care is required in handling the photomask and good quality of the photomasks can be maintained only with expenses more than negligible. Moreover, needless to say, the pattern on the photomask must be of the full-size relative to the pattern to be reproduced so that a patterned photomask having such a high precision is unavoidably very expensive, especially, when the line width of the pattern is in the submicron range.

In the method of exposure by minifying projection, on the other hand, the dimension of the pattern on a patterned photomask can be as large as 5 to 10 times of that in the photoresist pattern to be reproduced so that even a photomask of high precision for patterning in the submicron range can be obtained with a relatively low cost. On the contrary to this advantage, this method is disadvantageous in respect of the contrast of light between the areas to be exposed and not to be exposed in comparison with the exposure by direct contacting of the photomask. Therefore, this method of exposure by minifying projection is applicable to the reproduction of a pattern of high precision only when the photoresist composition is inherently highly sensitive in exposure to light with relatively low contrast.

In the manufacture of semiconductor devices such as VLSIs, furthermore, the pattern to be formed in the photoresist layer is not composed of lines having one and the same line width but includes lines having varied line widths combined in a complicated manner. This fact causes a difficult problem affecting the quality of pattern reproduction since the minimum exposure dose by which the photoresist layer on the exposed areas can be removed away by development considerably depends on the line width. Taking the minimum exposure dose to a pattern of 2.0 $\mu$m line width as unity, for example, the minimum exposure does to patterns of 1.5 $\mu$m and 1.0 $\mu$m line widths are 1.2 to 1.3 and 1.5 to 1.7, respectively. Therefore, an exposure dose which is optimum for a line of certain line width may be too small or too large for lines having a smaller or larger line width, respectively, in the same pattern to cause insufficient reproduction of finer lines or excessive removal of the photoresist layer of the coarser lines so that the fidelity of pattern reproduction cannot be highest over whole area of the pattern. Moreover, the surface of a semiconductor device under way of processing is not completely flat but usually has a stepwise height difference of 0.5 to 1.0 μm from portion to portion so that the thickness of a photoresist layer formed on such a stepwise surface cannot be uniform to be smaller in the upside area of the step and larger in the downside area of the step. When such a photoresist layer is exposed to light and developed, therefore, it is usual that the line width of the pattern reproduced in the photoresist layer is smaller in the area where the photoresist layer has a smaller thickness than in the area where the thickness is larger affecting the fidelity of pattern reproduction.

In connection with the process of etching on the surface of a semiconductor wafer on which a patterned photoresist layer of submicron fineness is formed, an undesirable phenomenon of side etching is unavoidable more or less in a wet process so that the process of etching is sometimes performed by a dry process free from side etching by use of plasma. In this dry etching method, however, the patterned photoresist layer as the etching mask is attacked by the plasma to cause gradual reduction in the film thickness. Accordingly, it is a desirable condition that the patterned line of the photoresist layer has a cross section in which the width of the line is not affected even when the film thickness is reduced by the attack of the plasma in the process of dry etching.

The above described problems each concern the poor reproducibility or fidelity between the original of the pattern on the photomask and the patterned image reproduced in the photoresist layer. The reasons therefor include, as is mentioned above, the decrease in the contrast in the exposure by minifying projection between the exposed and unexposed areas, difference in the optimum exposure doses between line patterns having different line widths, difference in the film thickness of the photoresist layer between the areas on both sides of a step on the wafer surface having stepwise height differences, and so on.

These problems can be solved as a whole only by the use of a photoresist composition having high fidelity in pattern reproduction and free from the influence of the exposure dose on the dimensions of the reproduced pattern. The photoresist composition free from the influence of the exposure dose on the dimensions of the reproduced pattern here implied should have following characteristics. Namely, the reproduced line pattern should have a line width which is an accurate reproduction of the line in the original pattern on the photomask without expansion or diminishment irrespective of the exposure dose or the extent of development. The patterned line of the photoresist layer should have a rectangular cross section standing on the substrate surface with definitely angled shoulders while undesirable cross sectional configurations include those having trailing skirts on the substrate surface even with definitely angled shoulders because the photoresist layer may disappear in the thin skirt portions by the attack of the etching plasma to cause a change in the line width of the photoresist pattern.

The specification of U.S. Pat. No. 4,587,196 recently published discloses a positive-working photoresist composition having a high sensitivity in exposure to light. The composition is formulated with a cresol novolac resin and a photosensitizing agent, of which the cresol moiety in the cresol novolac resin is derived from an isomeric mixture of o-, m- and p-cresols in a specified proportion. In particular, a preferable isomeric isomer of cresols contains at least 47% of m-cresol, the balance being p-cresol optionally combined with o-cresol. According to the disclosure, the composition is imparted with a greatly improved sensitivity to light as compared with similar compositions in which the cresol novolac resin is derived from an isomeric mixture of cresols with a smaller proportion of m-cresol. When the proportion of m-cresol is decreased to 45%, the balance being p-cresol, for example, the photosensitivity of the resultant photosensitive resin composition is greatly decreased. Despite the improvement in the sensitivity as taught there, such a photosensitive resist composition derived, for example, from a cresol mixture of 50% m-cresol and 50% p-cresol is not quite satisfactory in respect of the fidelity in the pattern reproduction in the sense mentioned above. Accordingly, it is eagerly desired to develop a photosensitive resist composition capable of giving a resist pattern of high fidelity because this is the key requirement to comply with the recent technological trend in the photosensitive resin composition assuming that a more powerful light source can be used to compensate the decrease in the photosensitivity.

SUMMARY OF THE INVENTION

An object of the present invention is therefore to provide a positive-working photoresist composition free from the above described problems capable of giving a patterned photoresist layer which is an accurate reproduction of the original pattern with high fidelity and unaffected by the influence of the exposure dose on the width of the patterned lines.

Thus, the positive-working photoresist composition provided by the invention comprises:

(A) 100 parts by weight of a cresol novolac resin as a film-forming constituent; and (B) from 25 to 60 parts by weight of a naphthoquinone diazide sulfonic acid ester as a photosensitive constituent, the cresol moiety in the cresol novolac resin being derived from an isomeric mixture of cresol composed of 35 to 43% of m-cresol and 65 to 57% of p-cresol with substantial absence of o-cresol.

DETAILED DESCRIPTION OF THE PREFERRED EMBODIMENTS

Figure 1:
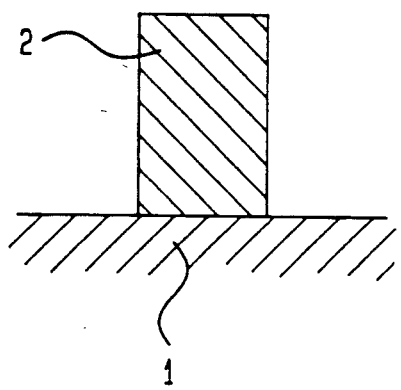
FIGS. 1, 2, 3 and 4 each schematically illustrate a cross section of a patterned line of the photoresist layer produced in Examples and Comparative Examples.

As is understood from the above given summarizing description, the most characteristic feature of the inventive photoresist composition consists in the specific cresol novolac resin as the film-forming constituent which is a novolac resin prepared from a mixture of cresol isomers composed of m- and p-cresols with substantial absence of o-cresol in a specified proportion. Although a mixed cresol containing o-cresol in a small proportion can be used in the invention, the content of o-cresol should not exceed 1% or should be as small as possible in the cresol mixture in order to fully achieve the object of the invention.

The naphthoquinone diazide sulfonic acid ester, i.e. component (B), as the principal ingredient of the photosensitive ingredient in the inventive photoresist composition is a reaction product obtained by the esterification reaction of a naphthoquinone diazide sulfonic acid and a phenolic compound such as polyhydroxy benzophenones, alkyl gallates and the like and the reaction of esterification can be performed readily according to a conventional procedure.

The phenolic compound as one of the reactants in the esterification reaction is exemplified, in addition to the above mentioned polyhydroxy benzophenones, e.g., tetrahydroxy benzophenone, and alkyl gallates, by trihydroxybenzenes, trihydroxybenzene monoethers, 2,2',4,4'-tetrahydroxy diphenyl methane, 4,4'-dihydroxy diphenyl propane, 4,4'-dihydroxy diphenyl sulfone, 2,2'-dihydroxy-1,1'-dinaphthyl methane, 2-hydroxyfluorene, 2-hydroxy phenanthrene, polyhydroxy anthraquinones, purpurogallin and derivatives thereof, phenyl 2,4,6-trihydroxybenzoate and the like. Further, aromatic amine compounds can be used in place of these phenolic compounds.

The cresol novolac resin, i.e. component (A), as the film-forming constituent in the inventive photoresist composition is, as is mentioned above, a novolac resin prepared from a mixture of cresol isomers composed of 35 to 43% of m-cresol and 65 to 57% of p-cresol with substantial absence of o-cresol. When the requirement relative to the isomeric proportion of the cresol isomers in the starting cresol used in the preparation of the cresol novolac resin is not satisfied, the desired improvement in the photoresist composition cannot be fully achieved. For example, a cresol novolac resin prepared from an isomeric mixture of 45% m-cresol and 55% p-cresol gives a photosensitive resin composition which, however, is not quite satisfactory in respect of the poor cross sectional configuration of the line pattern formed therefrom having somewhat rounded shoulder portions as compared with the inventive photosensitive resin compositions.

The inventive photoresist composition should comprise from 25 to 60 parts by weight of the naphthoquinone diazide sulfonic acid ester as the photosensitive constituent per 100 parts by weight of the cresol novolac resin as the film-forming constituent. The inventive photoresist composition contains no more than one cresol novolac resin. When the amount of the photosensitive constituent is in excess of 60 parts by weight, the photoresist composition would have a remarkably decreased sensitivity while, when the amount thereof is too small, an adverse effect is caused on the cross sectional configuration of the line in the patterned photoresist layer.

The inventive positive-working photoresist composition is used usually in the form of a solution prepared by dissolving the above described cresol novolac resin and the naphthoquinone diazide sulfonic acid ester in a suitable organic solvent. Exemplary of the organic solvent used in this case are ketones, e.g., acetone, methyl ethyl ketone, cyclohexanone and isoamyl ketone, polyhydric alcohols and derivatives thereof, e.g., ethylene glycol, ethylene glycol monoacetate, diethylene glycol and monomethyl, monoethyl, monopropyl and monophenyl ethers of diethylene glycol monoacetate; cyclic ethers, e.g. dioxane; and esters, e.g., methyl acetate, ethyl acetate and butyl acetate. These organic solvents can be used either singly or as a mixture of two kinds or more according to need.

The inventive positive-working photoresist composition may be admixed optionally with various kinds of known additives having compatibility with the essential ingredients and conventionally used in photoresist compositions such as auxiliary resins, plasticizers, stabilizers, coloring agents to serve for further increasing the visibility of the patterned image after development and so on.

The procedure for forming a patterned photoresist layer using the inventive photoresist composition may be conventional. For example, the surface of a substrate body such as a semiconductor silicon wafer is coated with the inventive photoresist composition in the form of an organic solution by use of a suitable coating machine such as spinners followed by drying to form a uniform photoresist layer thereon, which is then exposed to light on a minifying projector or a suitable apparatus for exposure through a photomask bearing a desired pattern followed by development using a developer solution such as an aqueous solution of an organic base, e.g., tetramethyl ammonium hydroxide, in a concentration of 2 to 5% by weight so that the photoresist layer is selectively dissolved away on the areas where the photoresist composition has been imparted with increased solubility in the developer solution as a result of exposure to light to give a high-fidelity minified reproduction of the pattern of the photomask. Advantageously, the thus reproduced pattern is a very accurate reproduction of the photomask pattern to the utmost fineness hiving a line width in the submicron range with high dimensional accuracy. The dimensional accuracy is not affected even on a substrate surface having stepwise height differences in the exposure to light by minifying projection which may give poor contrast as a trend. Accordingly, the inventive positive-working photoresist composition can be used advantageously in the manufacture of high-precision semiconductor devices such as VLSIs.

In the following, the positive-working photoresist composition of the invention is illustrated in more detail by way of examples and comparative examples.

EXAMPLE 1

A cresol novolac resin was prepared according to a conventional procedure by the condensation reaction in a reaction mixture composed of 40:60 by weight mixture of m- and p-cresols and formalin in the presence of oxalic acid as the catalyst. A positive-working photoresist composition in the form of a solution was prepared by dissolving 100 parts by weight of the above prepared cresol novolac resin and 30 parts by weight of 2,3,4-trihydroxy benzophenone ester of naphtho-quinone-1,2-diazido-5-sulfonic acid in 390 parts by weight of ethylene glycol monoethyl ether acetate followed by filtration through a membrane filter having pores of 0.2 $\mu$m diameter.

A silicon wafer of 4 inch diameter was uniformly coated with the photoresist solution in a coating thickness of 1.3 $\mu$m as dried using a resist coater (Model TR-4000, manufactured by Tazmo Co.) followed by drying and prebaking for 90 seconds on a hot plate kept at 110° C. to give a photoresist layer on the wafer. The silicon wafer provided with the photoresist coating layer was then exposed for 880 milliseconds to ultraviolet light on a minifying projector (Wafer Stepper Model DSW-4800, manufactured by GCA Co.) through a test chart photomask (manufactured by Dai Nippon printing Co.) and developed for 30 seconds at 23° C. using a 2.38% by weight aqueous solution of tetramethyl ammonium hydroxide as the developer solution.

The sensitivity in this case was 880 milliseconds when the sensitivity was defined by taking the minimum exposure time required for complete dissolution of the photoresist layer in the line-wise areas of 1.0 μm line width after exposure to light as the indexing value.

The patterned lines of the photoresist layer thus developed had an ideally rectangular cross section as is schematically illustrated in FIG. 1 of the accompanying drawing showing the line 2 with perpendicularly upright side surfaces standing on the substrate 1.

EXAMPLES 2 to 8 AND COMPARATIVE EXAMPLES 1 to 11

The experimental procedure in each of these experiments was substantially the same as in Example 1 except that the weight ratio of the m- and p-cresols in the mixed cresols used in the preparation of the cresol novolac resin was varied as indicated in Table 1 below and that the photosensitive compound, which was one of the compounds I to VI shown below, was used in varied amounts as indicated in the table in parts by weight per 100 parts by weight of the cresol novolac resin.

Photosensitizer Compound

Figure 2:
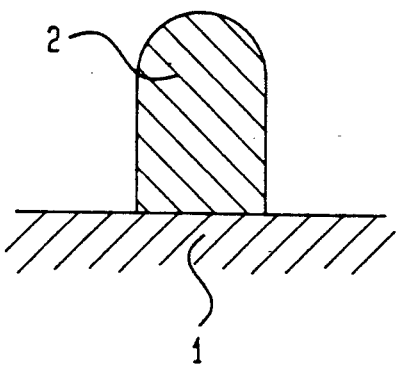
Figure 3:
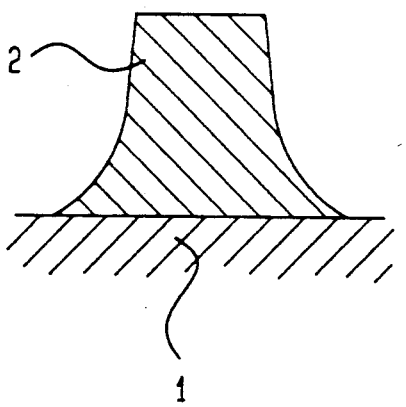
Figure 4:
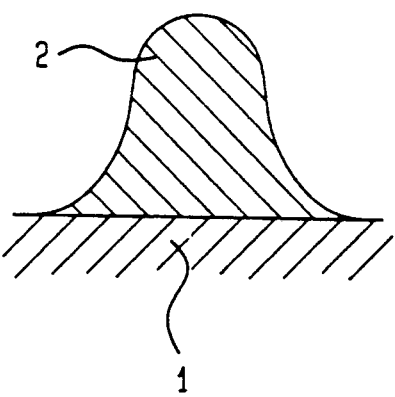

I: an esterification product of 1 mole of 2,3,4-trihydroxy benzophenone and 1.6 moles of naphthoquinone-1,2-diazido-5-sulfonyl chloride II: an esterification product of 1 mole of 2,4,6-trihydroxy benzophenone and 1.8 moles of naphthoquinone-1,2-diazido-5-sulfonyl chloride III: an esterification product of 1 mole of 2,3,4-trihydroxy benzophenone and 2.0 moles of naphthoquinone-1,2 diazido-5-sulfonyl chloride IV: an esterification product of 1 mole of 2,3,4-trihydroxy-4'-hydroxy benzophenone and 2.2 moles of naphthoquinone-1,2-diazido-5-sulfonyl chloride V: an esterification product of 1 mole of 1,2,3-trihydroxy benzene and 1.6 moles of naphthoquinone-1,2-diazido-5-sulfonyl chloride VI: an esterification product of 1 mole of phenyl 2,4,6-trihydroxy benzoate and 1.6 moles of naphthoquinone-1,2-diazido-5-sulfonyl chloride VII: an esterification product of 1 mole of 2,3,4-trihydroxy benzophenone and 3.0 moles of naphthoquinone-1,2-diazido-5-sulfonyl chloride Table 1 shows the sensitivity in milliseconds as defined above and the cross sectional form of the patterned line of the photoresist layer as indicated by the symbols A, B, C and D which correspond to the cross section of the patterned line 2 of the photoresist layer formed on the substrate 1 by development shown in FIGS. 1, 2, 3 and 4, respectively, in the accompanying drawing. The cross sectional form may be rectangular (A) as is illustrated in FIG. 1, rectangular but with rounded shoulders (B) as is illustrated in FIG. 2, plateau-like with definitely angled shoulders but with trailing skirts (C) as is illustrated in FIG. 3 or broad with rounded shoulders and trailing skirts (D) as is illustrated in FIG. 4.

TABLE 1

| | m-Cresol: p-cresol weight ratio | Photosensitizer Compound | Parts by weight | Sensitivity | Cross section of lines |
|---|---|---|---|---|---|
| Example | | | | | |
| 2 | 43:57 | IV | 30 | 370 | A |
| 3 | 37:63 | IV | 30 | 460 | A |
| 4 | 35:65 | IV | 25 | 500 | A |
| 5 | 40:60 | IV | 30 | 410 | A |
| 6 | 40:60 | I | 40 | 700 | A |
| 7 | 40:60 | V | 30 | 750 | A |
| 8 | 43:57 | VII | 25 | 400 | A |
| Comparative Example | | | | | |
| 1 | 60:40 | I | 30 | 370 | D |
| 2 | 50:50 | I | 30 | 390 | C |
| 3 | 47:53 | I | 30 | 450 | C |
| 4 | 60:40 | III | 30 | 450 | D |
| 5 | 70:30 | VI | 40 | 570 | C |
| 6 | 45:55 | I | 30 | 450 | B |
| 7 | 30:70 | I | 25 | 750 | B |
| 8 | 10:90 | II | 25 | 700 | B |
| 9 | 45:55 | I | 50 | 800 | B |
| 10 | 45:55 | IV | 30 | 390 | B |
| 11 | 45:55 | VII | 25 | 370 | B |

EXAMPLE 9

The experimental procedure was substantially the same as in Example 1 except that the test chart photomask was replaced with a test chart reticle having line-and-space patterns of 1.25 μm and 2.0 μm widths. The results were that the pattern of the photoresist layer produced on the silicon wafer was an accurate reproduction of the pattern on the test chart reticle with high fidelity.

COMPARATIVE EXAMPLE 12

The experimental procedure was substantially the same as in Comparative Example 1 except that the test chart photomask was replaced with the same test chart reticle as used in Example 10 and the length of the exposure time was 450 milliseconds. The results were that the line-and-space pattern of 1.25 μm width could be reproduced on the silicon wafer while the line-and-space pattern of 2.0 μm width was reproduced incompletely as composed of a line pattern of 1.6 μm width and a space pattern of 2.4 μm width.

What is claimed is:

1. A positive-working photoresist composition which comprises, in admixture:
   (A) 100 parts by weight of a cresol novolac resin as a film-forming constituent; and
   (B) from 25 to 60 parts by weight of a o-naphthoquinone diazide sulfonic acid ester as a photosensitive constituent, the cresol moiety in the cresol novolac resin being derived from a mixture of cresol isomers consisting of 35 to 43% of m-cresol and 65 to 57% of p-cresol with substantial absence of o-cresol, said photoresist composition containing no more than one cresol novolac resin.

2. The positive-working photoresist composition as claimed in claim 1 wherein the mixture of cresol isomers consists of 35 to 43% of m-cresol, 65 to 57% p-cresol and 1% or less of o-cresol.

3. The positive-working photoresist composition as claimed in claim 1 wherein the naphthoquinone diazide sulfonic acid ester is an esterification product of naphthoquinone-1,2-diazido-5-sulfonic acid and a polyhydroxy benzophenone.

* * * * *